United States Patent
Zhang et al.

(10) Patent No.: US 11,404,469 B2
(45) Date of Patent: Aug. 2, 2022

(54) FLAT PANEL DETECTOR AND MANUFACTURING METHOD THEREOF

(71) Applicants: Beijing BOE Optoelectronics Technology Co., Ltd., Beijing (CN); BOE Technology Group Co., Ltd., Beijing (CN)

(72) Inventors: Yong Zhang, Beijing (CN); Gang Hua, Beijing (CN); Yanna Xue, Beijing (CN); Jian Lin, Beijing (CN); Zhiying Bao, Beijing (CN); Lei Mi, Beijing (CN); Lu Bai, Beijing (CN); Haobo Fang, Beijing (CN); Jingpeng Wang, Beijing (CN); Limin Zhang, Beijing (CN)

(73) Assignees: Beijing BOE Optoelectronics Technology Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 209 days.

(21) Appl. No.: 16/609,978

(22) PCT Filed: Apr. 24, 2019

(86) PCT No.: PCT/CN2019/084055
§ 371 (c)(1),
(2) Date: Oct. 31, 2019

(87) PCT Pub. No.: WO2020/001145
PCT Pub. Date: Jan. 2, 2020

(65) Prior Publication Data
US 2021/0288101 A1  Sep. 16, 2021

(30) Foreign Application Priority Data
Jun. 29, 2018  (CN) .......................... 201810712771.1

(51) Int. Cl.
*H01L 27/146* (2006.01)

(52) U.S. Cl.
CPC .... *H01L 27/14663* (2013.01); *H01L 27/1462* (2013.01); *H01L 27/14636* (2013.01); *H01L 27/14685* (2013.01); *H01L 27/14692* (2013.01)

(58) Field of Classification Search
CPC .......... H01L 27/14663; H01L 27/1462; H01L 27/14636; H01L 27/14685; H01L 27/14692
See application file for complete search history.

(56) References Cited

U.S. PATENT DOCUMENTS

| | | | |
|---|---|---|---|
| 6,784,949 B1* | 8/2004 | Nagata | G02F 1/136213 349/39 |
| 7,321,672 B2* | 1/2008 | Sasaki | G06V 40/1329 250/556 |

(Continued)

FOREIGN PATENT DOCUMENTS

| | | |
|---|---|---|
| CN | 1674038 A | 9/2005 |
| CN | 101930077 A | 12/2010 |

(Continued)

OTHER PUBLICATIONS

"First Examination Report (English Translation)", India Patent Application No. 202047019842, dated Jul. 7, 2021, 4 pp.

(Continued)

*Primary Examiner* — David P Porta
*Assistant Examiner* — Djura Malevic
(74) *Attorney, Agent, or Firm* — Myers Bigel, P.A.

(57) ABSTRACT

A flat panel detector is provided, which includes a substrate and a plurality of photodiodes on the substrate. The flat panel detector further includes a first transparent conductive layer disposed on a side of the photodiodes away from the (Continued)

substrate. An orthographic projection of the first transparent conductive layer on the substrate at least partially overlaps the orthographic projection of each photodiode of the plurality of photodiodes on the substrate. The flat panel detector can mitigate or reduce the influence of external static electricity and improve the working stability.

12 Claims, 7 Drawing Sheets

(56) References Cited

U.S. PATENT DOCUMENTS

| | | | | |
|---|---|---|---|---|
| 7,326,936 | B2* | 2/2008 | Kawano | G01J 5/20 250/338.2 |
| 8,368,027 | B2* | 2/2013 | Ishii | G01T 1/2018 250/366 |
| 9,678,614 | B2* | 6/2017 | Xu | G06F 3/0443 |
| 9,941,324 | B2* | 4/2018 | Nara | H01L 29/66969 |
| 10,096,642 | B2* | 10/2018 | Ishino | H01L 27/14663 |
| 10,468,450 | B2* | 11/2019 | Karim | H01L 27/14612 |
| 2005/0213173 | A1* | 9/2005 | Sasaki | G06V 40/1329 358/514 |
| 2008/0284314 | A1* | 11/2008 | Song | G09G 3/22 315/169.3 |
| 2010/0320391 | A1 | 12/2010 | Antonuk | |
| 2011/0127593 | A1 | 6/2011 | Hayashi | |
| 2011/0139994 | A1 | 6/2011 | Lee et al. | |
| 2013/0048860 | A1 | 2/2013 | Nishino et al. | |
| 2016/0357283 | A1* | 12/2016 | Xu | G02F 1/133308 |
| 2017/0084665 | A1 | 3/2017 | Caris et al. | |
| 2017/0250214 | A1* | 8/2017 | Sekine | H01L 27/1225 |
| 2017/0373111 | A1 | 12/2017 | Tomyo et al. | |
| 2018/0151649 | A1* | 5/2018 | Han | H01L 51/50 |
| 2021/0210535 | A1 | 7/2021 | Jiang et al. | |

FOREIGN PATENT DOCUMENTS

| | | |
|---|---|---|
| CN | 102096089 A | 6/2011 |
| CN | 203055911 U | 7/2013 |
| CN | 103779362 A | 5/2014 |
| CN | 105514029 A | 4/2016 |
| CN | 107104108 A | 8/2017 |
| EP | 2869338 A1 | 5/2015 |
| JP | 2013065825 A | 4/2013 |
| KR | 20110066029 A | 6/2011 |
| KR | 20110067818 A | 6/2011 |
| KR | 20120027541 A | 3/2012 |

OTHER PUBLICATIONS

"First Office Action and English language translation", Chinese Patent Application No. 201810712771.1, dated Jun. 16, 2021, 16 pp.
First Office Action and English language translation, KR Application No. 10-2020-7018739, dated Dec. 1, 2021, 20 pp.
Extended European Search Report Corresponding to European Application No. 19825780.0 (6 pages) (dated Mar. 15, 2022).

* cited by examiner

FLAT PANEL DETECTOR AND MANUFACTURING METHOD THEREOF

RELATED APPLICATION

Cross Reference to Related Applications

The present application is a 35 U.S.C. 371 national stage application of PCT international Application No. PCT/CN2019/084055 filed on Apr. 24, 2019, which claims the benefit of Chinese Patent Application No. 201810712771.1, filed on Jun. 29, 2018, the entire disclosures of which are incorporated herein by reference.

TECHNICAL FIELD

The present disclosure relates to the field of ray detection technologies, and in particular to a flat panel detector.

BACKGROUND

An X-ray flat panel detector is an X-ray detector with a photoelectric conversion array as its core. Under X-ray irradiation, the scintillator or phosphor layer of the detector converts X-ray photons into visible light. The visible light is then transformed by the array having a photoelectric conversion function into an image electrical signal, and the image electrical signal undergoes transmission and analog-to-digital conversion by peripheral circuits, thereby obtaining a digitized image.

SUMMARY

A flat panel detector is provided by an embodiment of the disclosure, which comprises a substrate and a plurality of photodiodes on the substrate. The flat panel detector further comprises a first transparent conductive layer arranged on a side of the plurality of photodiodes away from the substrate, and an orthographic projection of the first transparent conductive layer on the substrate at least partially overlaps an orthographic projection of each photodiode of the plurality of photodiodes on the substrate.

In some embodiments, the orthographic projection of the first transparent conductive layer on the substrate covers orthographic projections of the plurality of photodiodes on the substrate.

In some embodiments, the first transparent conductive layer is configured to be electrically connected to a constant voltage source.

In some embodiments, the flat panel detector further comprises a signal line connected to the photodiode to provide a bias voltage to the photodiode.

In some embodiments, the signal line is disposed between the first transparent conductive layer and the photodiode.

In some embodiments, the flat panel detector comprises a passivation layer between the first transparent conductive layer and the signal line.

In some embodiments, the first transparent conductive layer is in direct contact with the signal line.

In some embodiments, the first transparent conductive layer comprises a plurality of conductive patterns, the plurality of conductive patterns are connected together by conductive connection sections.

In some embodiments, the flat panel detector further comprises a plurality of gate scanning lines and a plurality of data lines on the substrate, the plurality of gate scanning lines and the plurality of data lines intersect each other to form a plurality of photosensitive regions arranged in an array. The plurality of conductive patterns are located within the plurality of photosensitive regions respectively, each photosensitive region comprises at least one photodiode of the plurality of the photodiodes, an orthographic projection of each conductive pattern of the plurality of conductive patterns on the substrate at least partially overlaps an orthographic projection of the at least one photodiode within a corresponding photosensitive region on the substrate.

In some embodiments, the flat panel detector further comprises a thin film transistor on the substrate, the thin film transistor is electrically connected to the gate scanning line, the data line, and the photodiode, respectively, an orthographic projection of the signal line on the substrate covers an orthographic projection of an active layer of the thin film transistor on the substrate.

In some embodiments, the first transparent conductive layer is a continuous planar conductive layer covering all photosensitive regions of the flat panel detector.

In some embodiments, the flat panel detector further comprises a plurality of gate scanning lines, a plurality of data lines and a thin film transistor on the substrate, the thin film transistor is electrically connected to the gate scanning line, the data line and the photodiode, respectively. The first transparent conductive layer comprises an opening corresponding to the thin film transistor, an orthographic projection of the opening on the substrate overlaps an orthographic projection of the thin film transistor on the substrate.

In some embodiments, the flat panel detector further comprises a second transparent conductive layer on a side of each photodiode of the plurality of photodiodes close to the signal line, an orthographic projection of the second transparent conductive layer on the substrate is located within an orthographic projection of the photodiode on the substrate.

In some embodiments, the substrate comprises a bonding region, the flat panel detector further comprises a conduction pattern in the bonding region, the conduction pattern is formed of a same material in a same layer as the first transparent conductive layer.

Another embodiment of the disclosure provides a method for manufacturing a flat panel detector, comprising: forming a photodiode on a substrate, and forming a first transparent conductive layer on the substrate on which the photodiode is formed, an orthographic projection of the first transparent conductive layer on the substrate at least partially overlapping an orthographic projection of the photodiode on the substrate.

In some embodiments, the method further comprises: forming a signal line connected to the photodiode on the substrate, the signal line being configured to provide a working voltage to the photodiode, and forming the first transparent conductive layer on the signal line.

In some embodiments, the signal line is in direct contact with the first transparent conductive layer.

In some embodiments, the method further comprises: forming a passivation layer on the signal line prior to forming the first transparent conductive layer.

In some embodiments, the substrate comprises a bonding region, the method further comprises: forming the first transparent conductive layer and forming a conduction pattern in the bonding region during a single patterning process.

Some embodiments of the disclosure have been summarized above. In the absence of contradiction and conflict, the above-described embodiments and the features in these embodiments may be combined in different ways to obtain other different embodiments, and these other embodiments also fall within the scope of the present application.

BRIEF DESCRIPTION OF DRAWINGS

In order to more clearly illustrate the technical solutions of embodiments herein, the drawings for describing the embodiments will be briefly described below. The drawings below merely illustrate some embodiments of the present disclosure, and one of ordinary skill in the art can obtain other drawings based on these drawings without inventive efforts.

DETAILED DESCRIPTION OF EMBODIMENTS

The technical solutions in embodiments of the present disclosure will be clearly and completely described below with reference to the accompanying drawings of the present disclosure. The described embodiments are only a part of possible embodiments of the disclosure, rather than all of them. All other embodiments obtained by one of ordinary skill in the art based on the embodiments herein without inventive efforts shall fall within the scope of the application.

Figure 1:
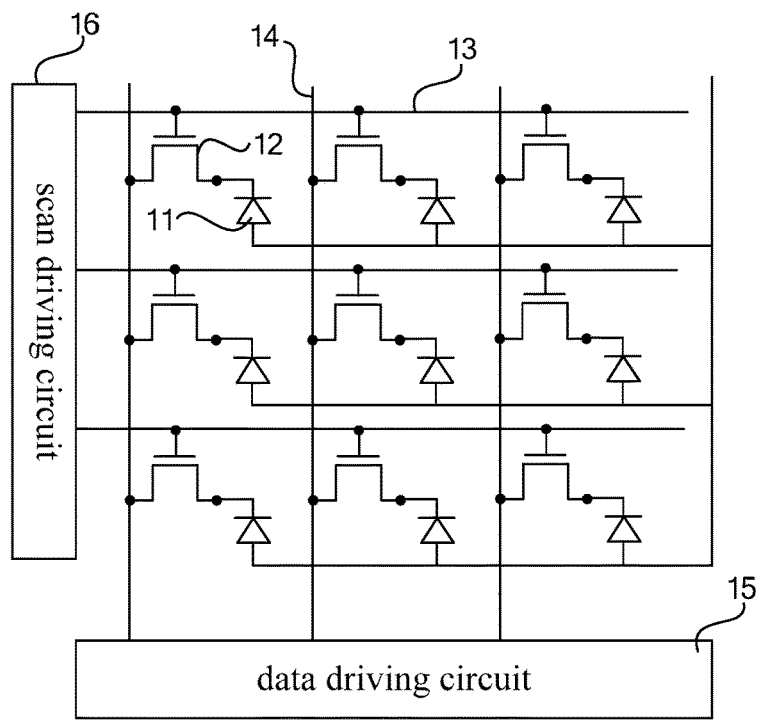
FIG. 1 is a schematic view of a flat panel detector provided by an embodiment of the present disclosure.

FIG. 1 illustrates the structure of a flat panel detector provided by an embodiment of the disclosure. As shown in FIG. 1, each photosensitive region (i.e., the region formed by gate scanning lines 13 and data lines 14, which is similar to a pixel region of a liquid crystal display) of the flat panel detector comprises a photodiode 11 and a thin film transistor 12. A gate of the thin film transistor 12 is connected to a gate scanning line 13 of the flat panel detector, a drain of the thin film transistor 12 is connected to a data line 14 of the flat panel detector, a source of the thin film transistor 12 is connected to the photodiode 11, and one end of the data line 14 is electrically connected to a data driving circuit 15.

The flat panel detector controls the on/off state of the thin film transistor 12 through a scan driving circuit 16. When the thin film transistor 12 is turned on, the photocurrent signal generated by the photodiode 11 is read by the data driving circuit 15 through the data line 14 connected to the thin film transistor 12. Collection of the photocurrent signal is accomplished by controlling the timing of the signal on the gate scanning line 13, that is, the photocurrent signal generated by the photodiode 11 is collected by controlling the on/off state of the thin film transistor 12.

Figure 2:
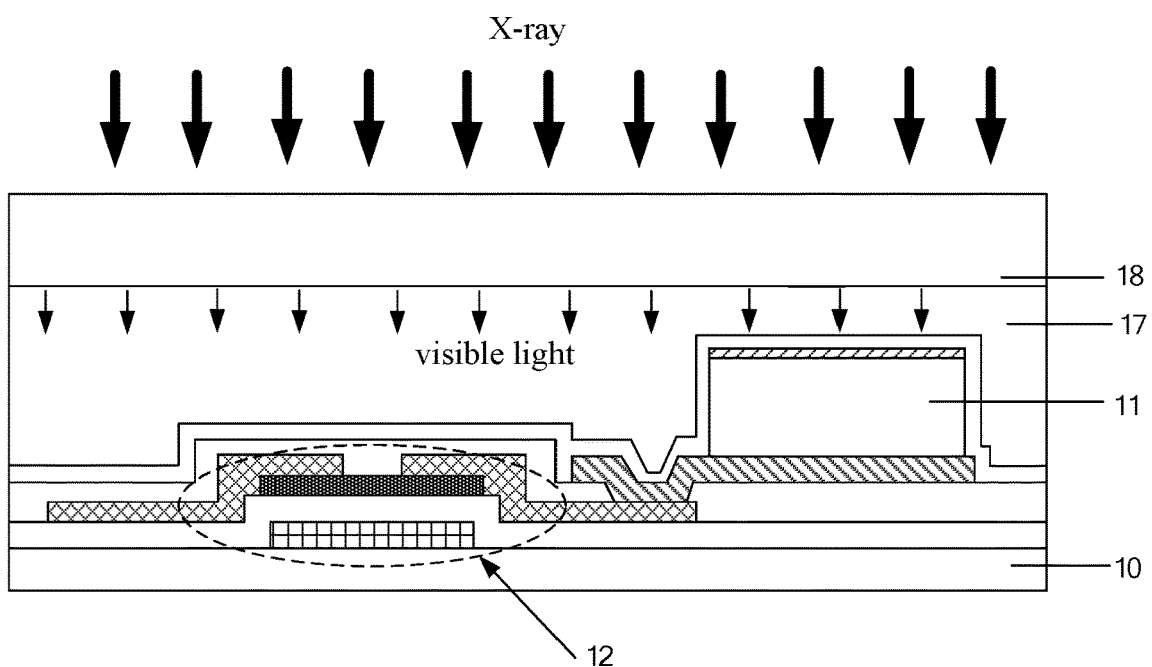
FIG. 2 is a schematic partial sectional view of a flat panel detector provided by an embodiment of the present disclosure.

FIG. 2 is a partial sectional view of an amorphous silicon flat panel detector provided by an example of the disclosure. As shown in FIG. 2, the main structure of the flat panel detector comprises a substrate 10, a photodiode 11 and a thin film transistor 12 on the substrate 10, a planarization layer 17 covering the photodiode 11 and the thin film transistor 12, and a scintillation layer 18 on the planarization layer 17. The photodiode 11 may comprise an N-type semiconductor layer, an intrinsic semiconductor layer, and a P-type semiconductor layer. The thin film transistor 12 comprises a gate, a gate insulating layer, an active layer, a source and a drain. The drain of the thin film transistor is connected to the N-type semiconductor layer of the photodiode. X-rays are modulated by an object to be detected, the modulated X-rays are converted into visible light by the scintillation layer 18, and the visible light is absorbed by the photodiode 11 and converted into charge carriers. The charge carriers may be stored in a storage capacitor or the photodiode's own capacitor, forming a charge image. The scan driving circuit 16 can sequentially turn on each row of thin film transistors 11 to output the charge image to the data driving circuit 15 in a row-by-row manner. The charge image transmitted through each thin film transistor 12 corresponds to a amount of incident X-rays, thus the amount of X-rays received by each photosensitive region can be judged by determining the amount of charges in each photosensitive region.

For the above-described flat panel detector of the disclosure, inventors of the application have realized that the flat panel detector described above does not have a counter substrate, and on the top of the flat panel detector is a thin passivation layer as a protective layer. As a result, such a flat panel detector is highly susceptible to external static electricity, so that the acquired images may be abnormal.

In view of this, a flat panel detector according to another embodiment of the disclosure comprises a substrate, and a plurality of photodiodes on the substrate. The flat panel detector further comprises a first transparent conductive layer disposed on a side of the photodiode away from the substrate, and an orthographic projection of the first transparent conductive layer on the substrate at least partially overlaps an orthographic projection of each photodiode among the plurality of photodiodes on the substrate. That is, at least a portion of the first transparent conductive layer is directly above the photodiode along the thickness direction (vertical direction) of the flat panel detector. The first transparent conductive layer may be electrically connected to a fixed potential (e.g., reference potential, etc.) when the flat panel detector is in operation. The electrostatic charges over the photodiode can be conducted or transferred via the first transparent conductive layer, thereby preventing the electrostatic charges from affecting the photodiodes and thus affecting the detection accuracy of the flat panel detector. In addition, since the first transparent conductive layer is light transmissive, it does not affect the transmission of light to the photodiodes. The flat panel detector provided by the embodiment will be specifically described below by way of specific examples.

Figure 3:
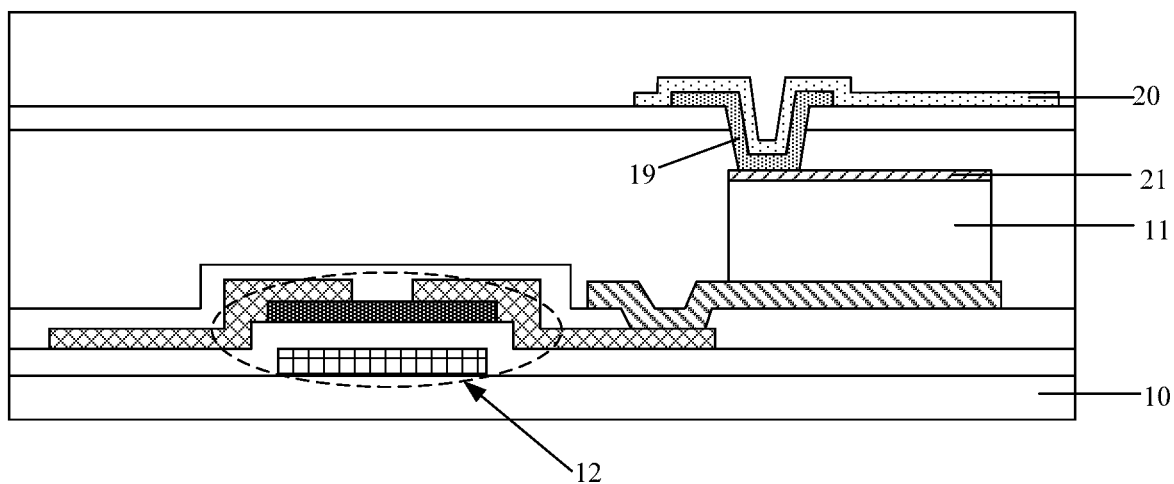
FIG. 3 is a schematic partial sectional view of a flat panel detector provided by another embodiment of the present disclosure.

A flat panel detector according to an embodiment of the present disclosure, as shown in FIG. 3, comprises a substrate 10, a plurality of photodiodes 11 on the substrate 10, and a signal line 19 disposed on a side of the photodiode 11 away from the substrate 10 and connected to the photodiode 11. The flat panel detector further comprises a first transparent conductive layer 20 disposed on a side of the photodiode 11 away from the substrate 10, and an orthographic projection of the first transparent conductive layer 20 on the substrate 10 at least partially overlaps an orthographic projection of the photodiode 11 on the substrate 10.

In an embodiment, the signal line 19 is configured to provide a bias voltage signal to photodiode 11, for example, the signal line 19 is electrically connected to a voltage source providing a constant negative voltage. In some embodiments, in order to enhance the optical signal reception of the photodiode 11, as shown in FIG. 3, a second transparent conductive layer 21 is disposed on a side of the photodiode 11 close to the signal line 19 to increase the electrically contacting area between the signal line 19 and the photodiode 11.

In the embodiment of FIG. 3, the first transparent conductive layer 20 and the signal line 19 are both disposed on a side of the photodiode 11 away from the substrate 10, but the relative positions between the first transparent conductive layer 20 and the signal line 19 are not limited. As shown in FIG. 3, the first transparent conductive layer 20 may be disposed on a side of the signal line 19 away from the photodiode 11, or the signal line 19 may be disposed on a side of the first transparent conductive layer 20 away from the photodiode 11. The first transparent conductive layer 20 and the signal line 19 may be directly connected, and an interlayer insulating layer may also be present therebetween. The structure of FIG. 3 is merely an example.

According to an embodiment of the disclosure, the orthographic projection of the first transparent conductive layer 20 on the substrate 10 at least partially overlaps the orthographic projection of a single photodiode 11 on the substrate 10. That is, the orthographic projection of the first transparent conductive layer 20 on the substrate 10 may partially overlap the orthographic projection of the photodiode 11 on the substrate 10, or the orthographic projection of the first transparent conductive layer 20 on the substrate 10 may include the orthographic projection of the photodiode 11 on the substrate 10, or the orthographic projection of the photodiode 11 on the substrate 10 may include the orthographic projection of the first transparent conductive layer 20 on the substrate 10.

As to the material of the first transparent conductive layer 20, a conductive material whose transmittance of light in the PIN operating band is 50% or more may be selected, for example, a transparent conductive material may be employed, which may be, for example, IZO (Indium Zinc Oxide), ITO (Indium Tin Oxide), AZO (Al Zinc Oxide), IFO (Indium F Oxide), and the like.

In some embodiments, the first transparent conductive layer 20 may comprise a plurality of conductive patterns in one-to-one correspondence with the plurality of photodiodes. The orthographic projection of each conductive pattern on the substrate at least partially overlaps the orthographic projection of a corresponding photodiode among the plurality of photodiodes on the substrate. Alternatively, in a further embodiment, the first transparent conductive layer 20 may be a planar integral structure corresponding to all of the photodiodes 11. For the flat panel detector provided by the embodiment of the present disclosure, the first transparent conductive layer 20 is disposed on a side of the photodiode 11 away from the substrate 10, so that during the operation of the flat panel detector, the first transparent conductive layer 20 having a certain potential is able to isolate external static electricity from the photodiode 11 while not affecting visible light being irradiated onto the photodiode 11, which can mitigate the influence of external static electricity on the photodiode 11, improve the antistatic ability of the flat panel detector, and ensure the yield of acquired images.

Figure 4:
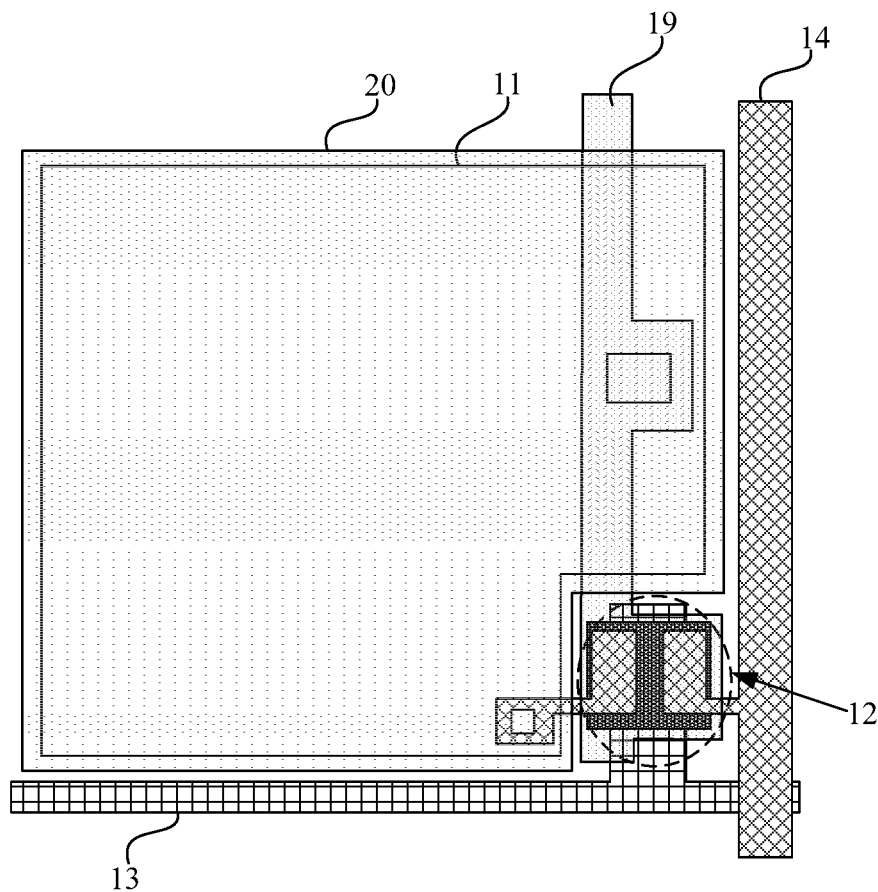
FIG. 4 is a schematic top view of a flat panel detector provided by an embodiment of the present disclosure.

In some embodiments, in order to enable the first transparent conductive layer 20 to minimize the influence of external static electricity on the photodiode 11, as shown in FIG. 4, the orthographic projection of the first transparent conductive layer 20 on the substrate 10 covers the orthographic projection of the photodiode 11 on the substrate 10. In the case where the first transparent conductive layer 20 is disposed between the signal line 19 and the photodiode 11, the signal line 19 may be electrically connected to the photodiode 11 through the first transparent conductive layer 20.

Figure 5:
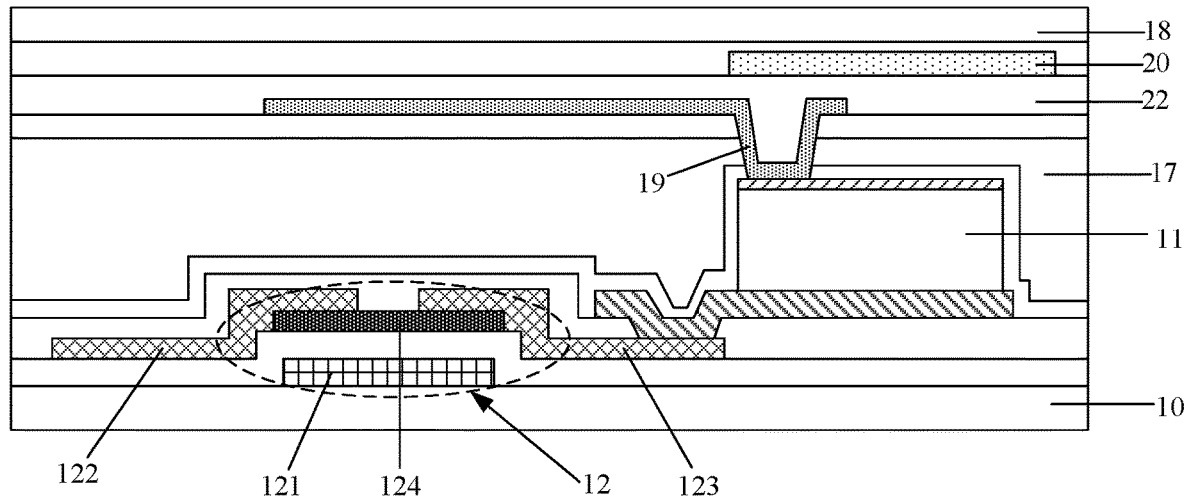
FIG. 5 is a schematic partial sectional view of a flat panel detector provided by another embodiment of the present disclosure.

In some embodiments, as shown in FIGS. 4 and 5, a signal line 19 is disposed between the first transparent conductive layer 20 and the photodiode 11. That is, the first transparent conductive layer 20 is disposed on a side of the signal line 19 away from the photodiode 11, and other interlayer structures may be disposed therebetween, or they may be in direct contact with each other. In the embodiments of FIG. 5 or FIG. 3, by disposing the signal line 19 between the first transparent conductive layer 20 and the photodiode 11, on the one hand, the first transparent conductive layer 20 can protect the signal line 19, and on the other hand, it is not necessary to form a via hole in the first transparent conductive layer 20, which is advantageous to complete coverage of the photodiode 11 by the first transparent conductive layer 20.

Figure 6:
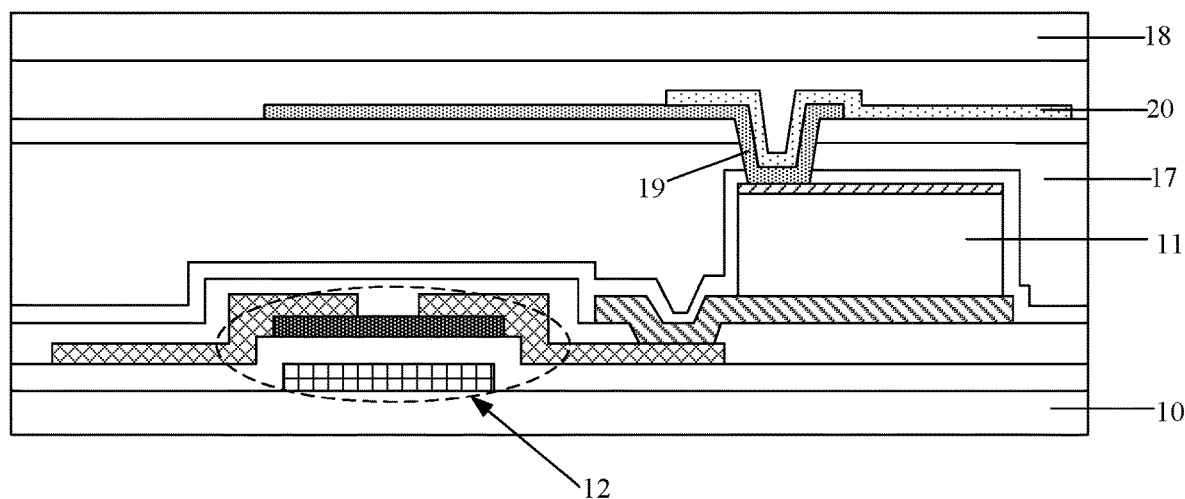
FIG. 6 is a schematic partial sectional view of a flat panel detector provided by another embodiment of the present disclosure.

In some embodiments, as shown in FIG. 5, a passivation layer 22 is disposed between the first transparent conductive layer 20 and the signal line 19. By disposing the passivation layer 22 between the first transparent conductive layer 20 and the signal line 19, the signal line can be fully protected, and it is beneficial to achieve a planar surface of the flat panel detector. In some embodiments, as shown in FIG. 6 or FIG. 3, the first transparent conductive layer 20 is directly disposed on the surface of the signal line 19. That is to say, after the signal line 19 is formed, the first transparent conductive layer 20 is formed without preparing the passivation layer 22. This can prevent the signal line 19 from being over etched under the influence of process fluctuations when the passivation layer 22 is being formed, which will lead to a problem that the image quality is affected by the signal fluctuation on the signal line 19. In addition, the first transparent conductive layer 20 is disposed on the surface of the signal line 19, so signal lines 19 for the photodiodes of different columns and different rows may be electrically connected to each other through the first transparent conductive layer 20, which can reduce the total impedance of the signal lines of the flat panel detector, thereby decreasing the voltage drop on the signal line, reducing the differences between the working voltages received by the photodiodes at different positions in the flat panel detector, and achieving compensation for the working voltage signal on the signal line 19. On the other hand, the first transparent conductive layer 20 can serve to protect the signal line 19, so that the stability of the signal on the signal line 19 can be improved. Furthermore, since the first transparent conductive layer 20 is in direct contact with the signal line 19, the potential of the first transparent conductive layer is the same as the potential of the signal line 19, there is no need for an individual signal source to provide a signal to the first transparent conductive layer 20, which simplifies the structure of the flat panel detector.

Figure 7:
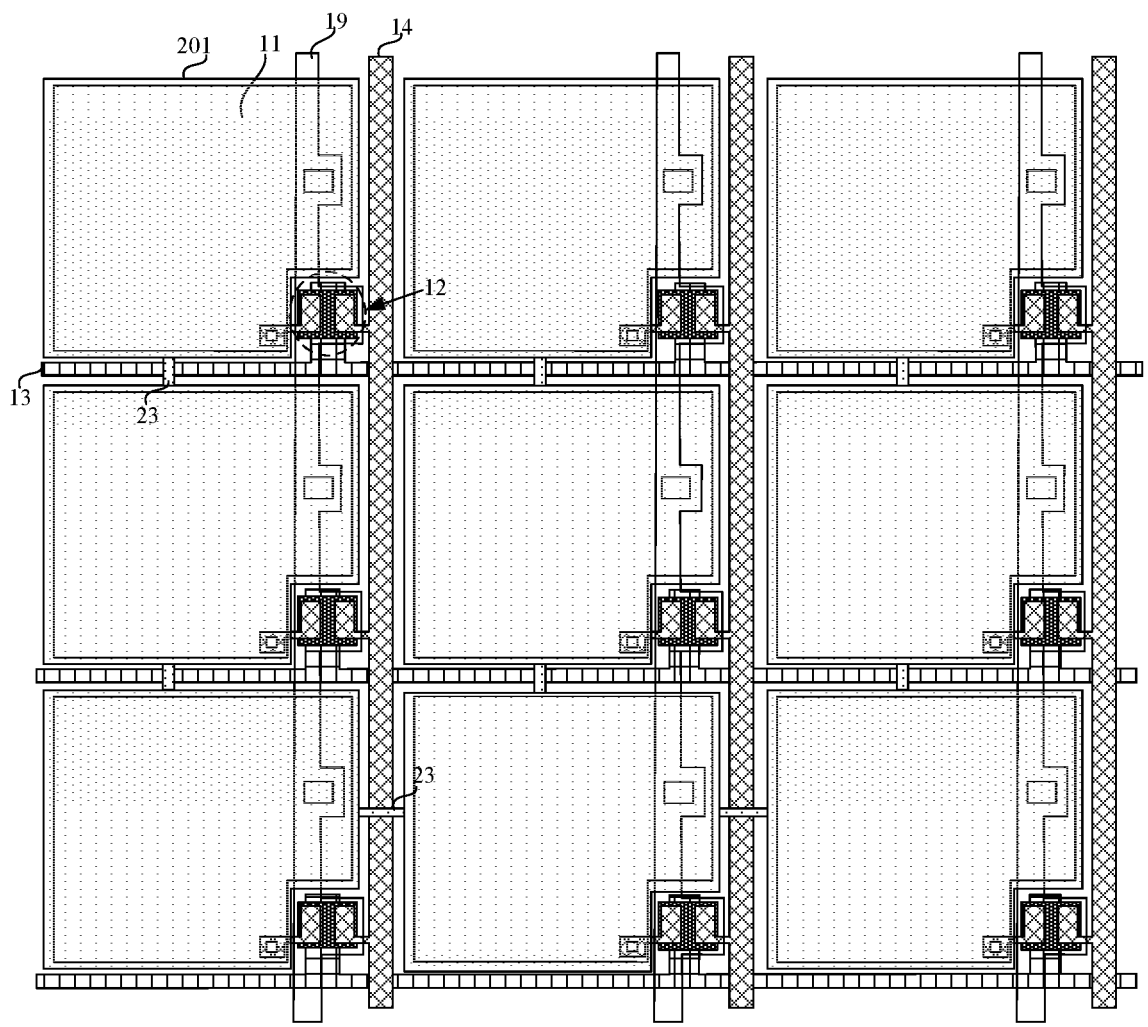
FIG. 7 is a schematic partial top view of a flat panel detector provided by a further embodiment of the present disclosure.

In some embodiments, as shown in FIG. 7, the first transparent conductive layer 20 comprises a plurality of conductive patterns 201, each of which corresponds to a photodiode 11. The plurality of conductive patterns 201 are connected by conductive connection sections 23.

Figure 8:
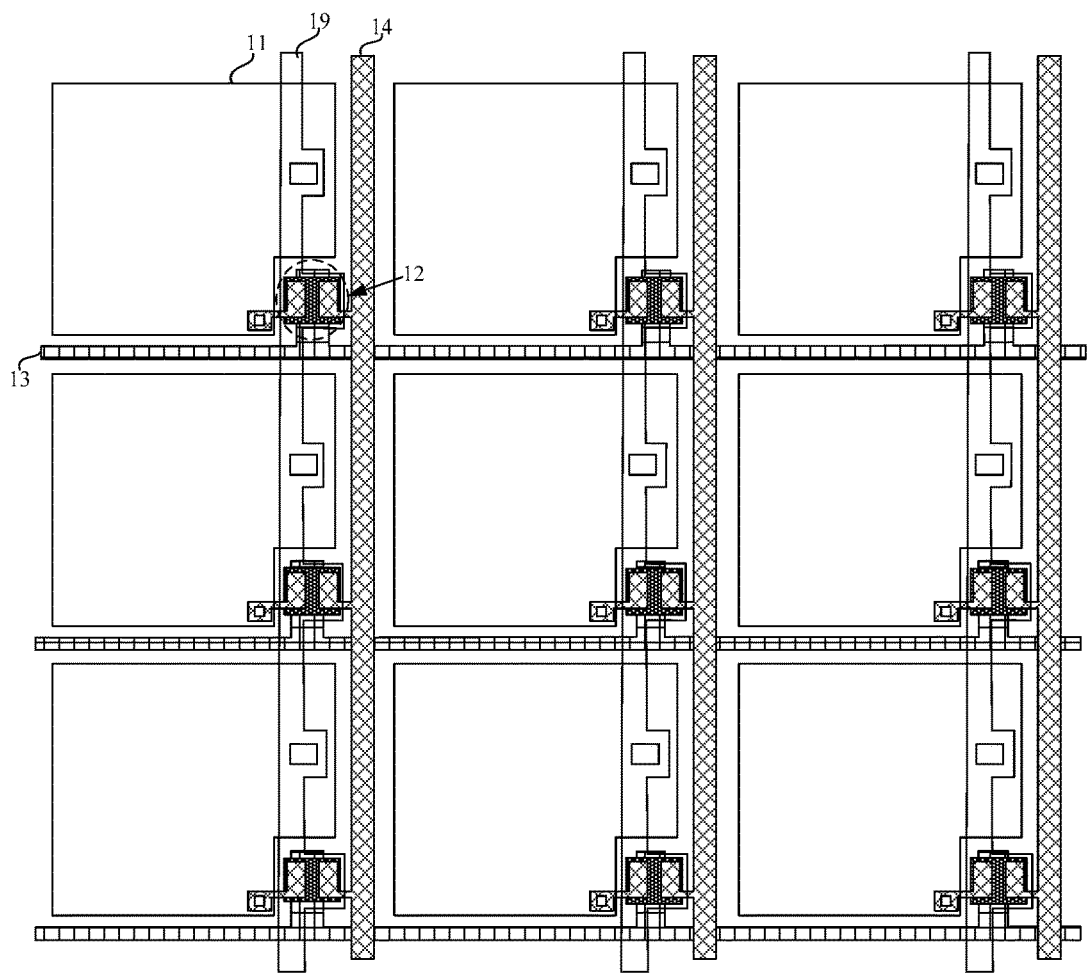
FIG. 8 is a schematic partial top view of a flat panel detector provided by yet another embodiment of the present disclosure.

FIG. 8 illustrates a structural view of a flat panel detector not provided with the first transparent conductive layer 20. FIG. 7 illustrates a view of a flat panel detector provided with the first transparent conductive layer 20. In the example of FIG. 7, one conductive pattern 201 corresponds to one photodiode 11. In a further embodiment, one conductive pattern 201 may correspond to a plurality of photodiodes 11. As shown in FIG. 7, the coverage region of the conductive connection section 23 intersects with the coverage region of the gate scanning line 13 or the data line 14. In order to avoid formation of a parasitic capacitance between the conductive connection section 23 and the gate scanning line 13 or the data line 14, which in turn affects the accuracy of the signal in the photodiode 11, the overlapping area between the conductive connection section 23 and the gate scanning line 13 or the data line 14 should be reduced as much as possible while ensuring connections between the conductive patterns 201.

The conductive connection sections 23 make it possible that the plurality of conductive patterns 201 of the flat panel detector are connected together to form an entirety. As shown in FIG. 7, it is not the case that a conductive connection section 23 has to be disposed between any two adjacent conductive patterns 201, it is just required that the disposed conductive connection sections 23 enable the plurality of conductive patterns 201 in the flat panel detector to be connected together. Of course, in order to ensure the stability of the connection, more conductive connection sections 23 may be disposed. The shapes and the arrangement of the conductive connection sections 23 shown in FIG. 7 are merely illustrative and are not intended to limit the present application.

The plurality of conductive patterns 201 are connected together by the conductive connection sections 23, so the conductive patterns 201 in the entire flat panel detector may receive the same voltage signal. In case the conductive patterns 201 are disposed on the signal line 19, a plurality of signal lines 19 in different columns and different rows are electrically connected to each other via the conductive patterns 201. As described above, this provides compensation for the voltage signals on the signal lines 19 to improve uniformity of the signals on the signal lines 19 at different positions of the flat panel detector, thereby improving the quality of acquired images.

In some embodiments, as shown in FIG. 7, a thin film transistor 12 connected to the photodiode 11, a gate scanning line 13 and a data line 14 connected to the thin film transistor 12 are arranged on the substrate 10. A plurality of gate scanning lines 13 and a plurality of data lines 14 intersect each other to form a plurality of photosensitive regions arranged in an array, and the conductive patterns 201 are located in the photosensitive regions. In FIG. 7, a bottom gate type thin film transistor is illustrated as an example, but this does not limit the scope of the present application.

In some embodiments, each of the conductive patterns 201 corresponds to each photodiode 11, the conductive pattern 201 is located within the photosensitive region, and the conductive patterns do not overlap the gate scanning lines 13 or the data lines 14.

In some embodiments, as shown in FIG. 5, the thin film transistor 12 comprises a gate 121, a source 122, and a drain 123. None of the orthographic projection of the gate 121, the orthographic projection of the source 122 and the orthographic projection of the drain 123 on the substrate 10 overlaps the orthographic projections of the conductive patterns 201 on the substrate 10. That is, the thin film transistor 12 is outside the photosensitive region. As shown in FIG. 5, in the thickness direction of the flat panel detector, the first transparent conductive layer 20 is not disposed directly above the gate 121, the source 122, and the drain 123 of the thin film transistor 12, that is, the conductive patterns 201 are not directly above the thin film transistor 12. As a result, the influence of the conductive patterns 201 on the performance of the thin film transistor 12 can be avoided or reduced. In other words, the orthographic projections of the conductive patterns 201 on the substrate 10 cover the orthographic projections of the photodiodes 11 on the substrate 10, but does not cover the orthographic projections of the gate 121, the source 122, and the drain 123 of the thin film transistor 12 on the substrate 10.

In some embodiments, as shown in FIG. 3, the signal line 19 does not shield the active layer of the thin film transistor 12 to simplify the layout of the signal line 19. Alternatively, in some embodiments, as shown in FIG. 5, the orthographic projection of signal line 19 on the substrate 10 covers the orthographic projection of active layer 124 of thin film transistor 12 on the substrate 10 such that the active layer 124 is shielded by the signal line 19 so as to prevent the active layer 124 from generating carriers due to illumination.

Figure 9:
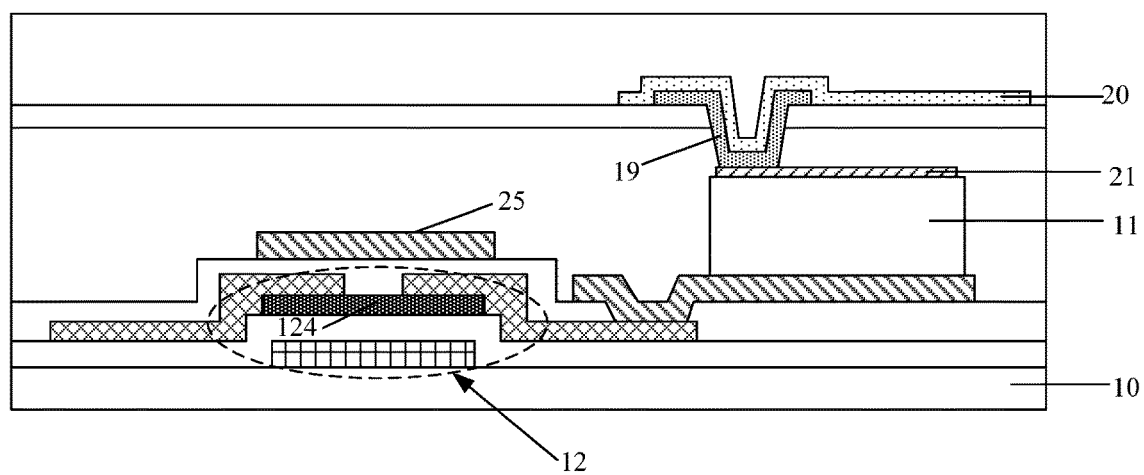
FIG. 9 illustrates a partial sectional view of a flat panel detector according to another embodiment of the present disclosure.

According to a further embodiment of the disclosure, the signal line 19 does not shield the active layer of the thin film transistor 12, and the flat panel detector comprises a light shielding layer 25. As shown in FIG. 9, the light shielding layer 25 is disposed above the active layer 124, preventing the active layer 124 from generating carriers due to illumination. Moreover, a second transparent conductive layer 21 is arranged on a side of the photodiode 11 close to the signal line 19, and the second transparent conductive layer 21 exposes a portion of the photodiode 11, that is, the orthographic projection of the second transparent conductive layer 21 on the substrate 10 is within the orthographic projection of the photodiode 11 on the substrate, thereby reducing or avoiding the occurrence of edge leakage current of the photodiode.

Figure 10:
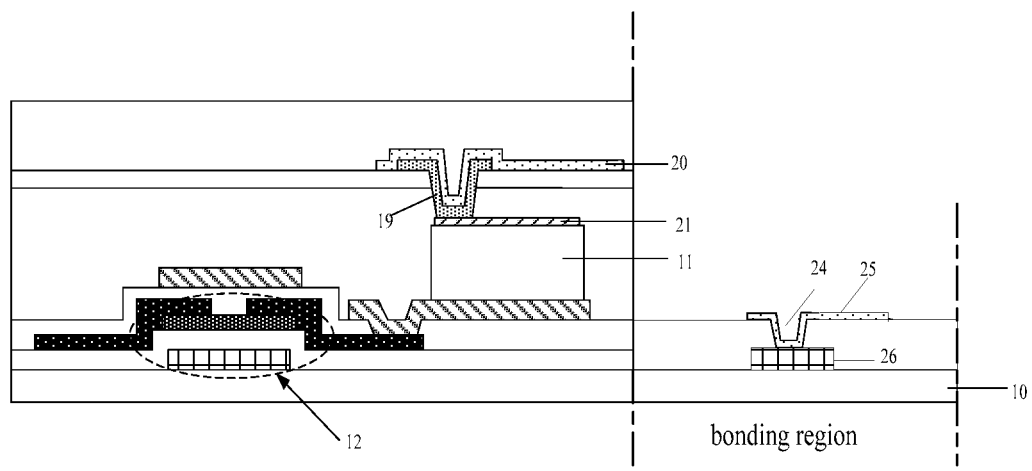
FIG. 10 illustrates a sectional view of a bonding region of a flat panel detector according to an embodiment of the present disclosure.

In some embodiments, the substrate 10 of the flat panel detector comprises a bonding region, and the flat panel detector further comprises a conduction pattern in the bonding region. The conduction pattern and the first transparent conductive layer 20 may be formed of the same material in the same layer. Related signal transmission lines (e.g., gate lines, data lines, etc.) in the flat panel detector may be electrically connected to external circuits (e.g., an integrated circuit chip) via the bonding region to provide necessary control signals for the electrical components on the substrate 10 and to analyze and process the electrical signals collected by the flat panel detector. The aforementioned signal transmission lines may extend to the bonding region, the bonding region may include conduction patterns corresponding to the aforementioned signal transmission lines, and the conduction patterns may be located above and electrically connected to the signal transmission lines. The conduction patterns in the bonding region may be exposed, so that the external circuits can be easily connected to the conduction patterns, thereby realizing electrical connections between the external circuits and the signal transmission lines. In addition, the conduction patterns can also provide protection for the signal transmission lines. For example, FIG. 10 illustrates an example of a schematic sectional view in which a bonding region is added on the basis of FIG. 9. As shown in FIG. 10, a gate line 26 electrically connected to the gate of the thin film transistor is formed in the bonding region of the substrate 10, an insulating layer and a conduction pattern 25 are formed over the gate line 26, and the conduction pattern 25 is electrically connected to the gate line through a via hole 24. Thus, an external circuit may be electrically connected to the gate line in the flat panel detector via the conduction pattern 25 to provide a control signal for the gate line.

In an embodiment of the disclosure, the first transparent conductive layer 20 and the conduction pattern in the bonding region are formed of the same material. Therefore, the first transparent conductive layer 20 and the conduction pattern in the bonding region may be formed in the same patterning process. Without increasing the number of mask processes, it is only necessary to change the pattern of the mask plate, which can simplify the manufacturing process of the flat panel detector.

Figure 11:
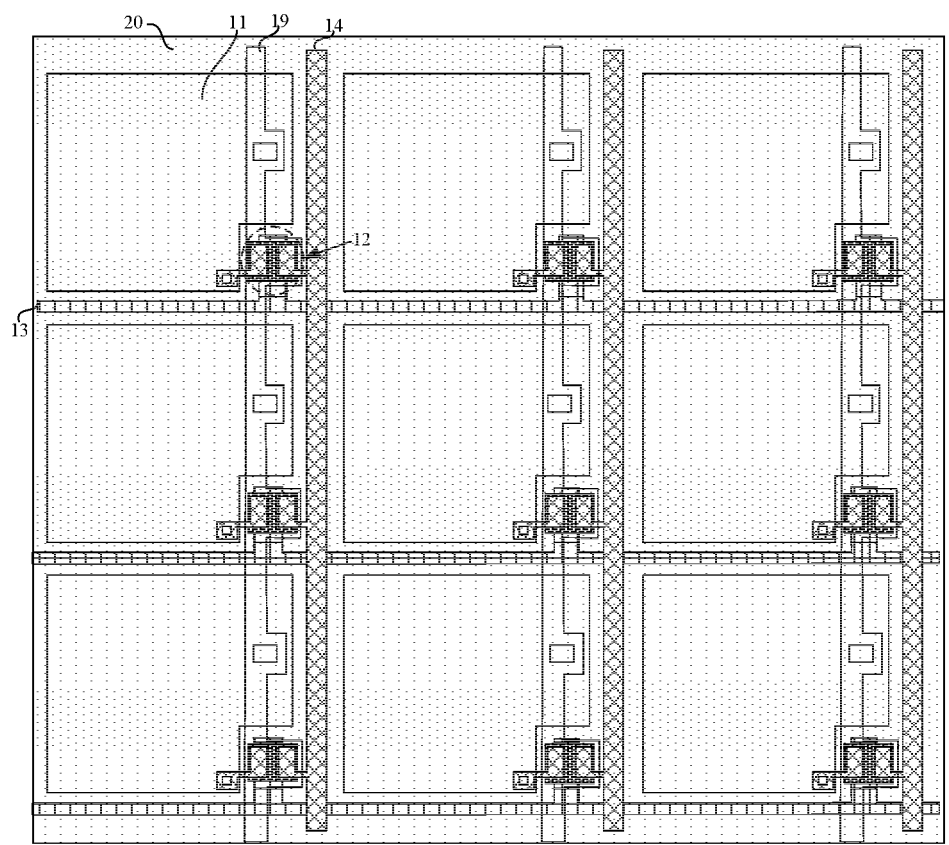
FIGS. 11 and 12 are partial top views of flat panel detectors provided by further embodiments of the present disclosure, respectively.
Figure 12:
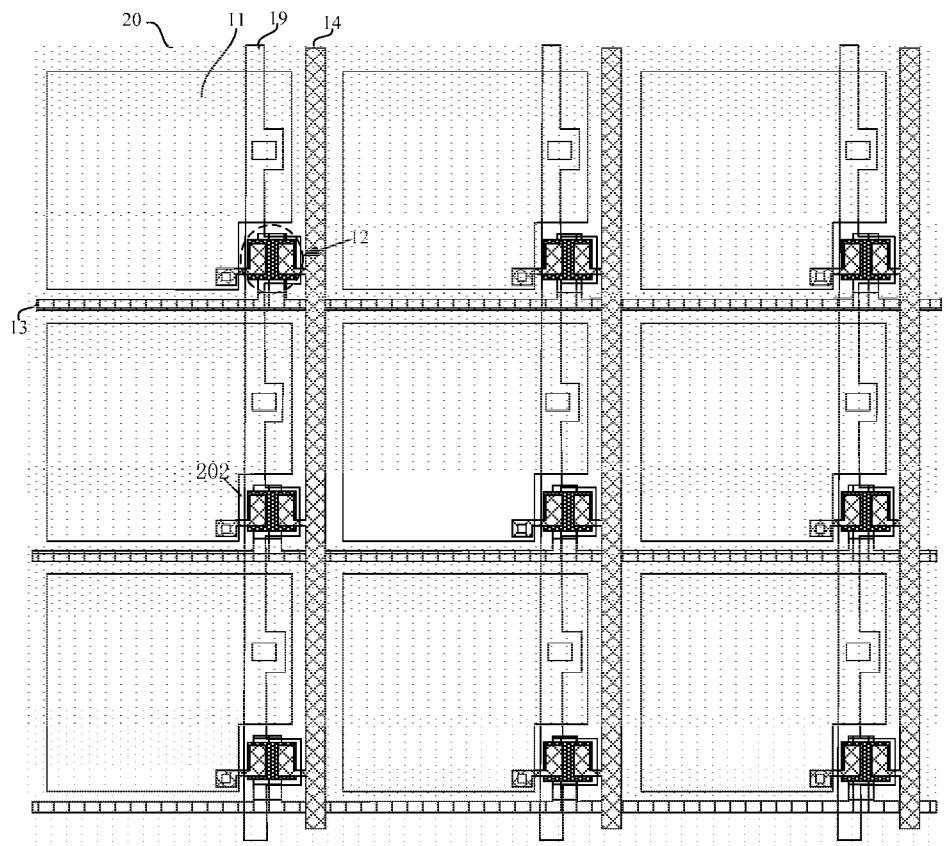

As previously described, in some embodiments, the first transparent conductive layer may be a continuous planar conductive layer that covers all of the photosensitive regions of the flat panel detector. FIG. 11 illustrates an example in which the first transparent conductive layer 20 covers all of the photosensitive regions of the flat panel detector. In a further embodiment, a plurality of openings corresponding to the thin film transistors may be formed in the continuous planar conductive layer. For example, as shown in FIG. 12, the orthographic projection of an opening 202 on the substrate overlaps the orthographic projection of a corresponding thin film transistor on the substrate.

Figure 13:
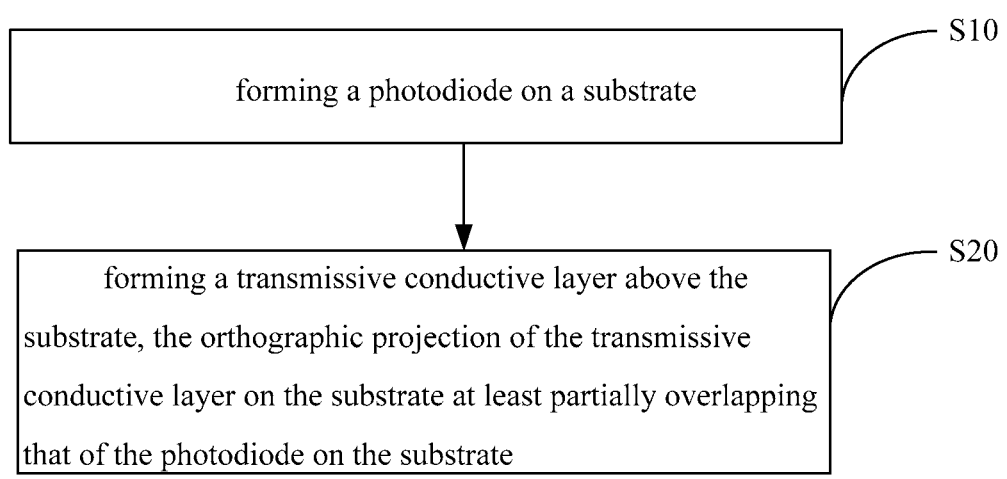
FIG. 13 is a flow chart of a method for manufacturing a flat panel detector provided by an embodiment of the disclosure.

Another embodiment of the disclosure further provides a method for manufacturing a flat panel detector, as shown in FIG. 13, comprising the following steps.

S10, forming a photodiode 11 on a substrate 10.

S20, forming a first transparent conductive layer 20 on the substrate 10 on which the photodiode 11 is formed, the orthographic projection of the first transparent conductive layer 20 on the substrate 10 at least partially overlaps the orthographic projection of the photodiode 11 on the substrate 10.

In some embodiments, step S20 comprises: S201, forming a signal line 19 connected to the photodiode 11 on the substrate 10 on which the photodiode 11 is formed, the signal line 19 being configured to provide a working voltage to the photodiode; S202, forming the first transparent conductive layer 20 on the substrate 10 on which the signal line 19 is formed. That is, after the photodiode 11 is formed, the signal line 19 is formed first, and the first transparent conductive layer 20 is then formed.

In some embodiments, the orthographic projection of the first transparent conductive layer 20 on the substrate 10 covers the orthographic projection of the photodiode 11 on the substrate 10.

In some embodiments, the first transparent conductive layer 20 is formed after a passivation layer 22 is formed on the substrate 10 on which the signal line 19 is formed.

In some embodiments, the substrate further comprises a bonding region, In order to further simplify the manufacturing process, a conduction pattern is formed in the bonding region while the first transparent conductive layer 20 is being formed, and the conduction pattern and the first transparent conductive layer are formed during the same patterning process. That is, the first transparent conductive layer 20 and the conduction pattern of the bonding region are formed synchronously.

The method for manufacturing a flat panel detector provided by the embodiment of the disclosure will be described below by way of specific examples.

The process of manufacturing the flat panel detector as shown in FIG. 5 may comprise the following steps.

S100, forming a thin film transistor 12 on the substrate 10.

By way of example, step S100 comprises: S110, forming a gate on the substrate 10. S120, forming a gate insulating layer on the substrate 10 on which the gate is formed. S120, forming an active layer on the substrate 10 on which the gate insulating layer is formed. S120, forming a source and a drain on the substrate 10 on which the active layer is formed.

S200, forming a photodiode 11 on the substrate 10 on which the thin film transistor 12 is formed.

As an example, step S200 comprises: S210, forming an N-type semiconductor layer on the substrate 10 on which the thin film transistor 12 is formed. S220, forming an intrinsic semiconductor layer on the substrate 10 on which the N-type semiconductor layer is formed. S230, forming a P-type semiconductor layer on the substrate 10 on which the intrinsic semiconductor layer is formed. S300, forming a planarization layer 17 on the substrate 10 on which the photodiode 11 is formed. S400, forming a signal line 19 on the substrate 10 on which the planarization layer 17 is formed. S500, forming a passivation layer 22 on the substrate 10 on which the signal line 19 is formed. S600, forming a first transparent conductive layer 20 on the substrate 10 on which the passivation layer 22 is formed, the orthographic projection of the first transparent conductive layer 20 on the substrate 10 covering the orthographic projection of the photodiode 11 on the substrate 10. S700, forming a scintillation layer 18 on the substrate 10 on which the first transparent conductive layer 20 is formed.

The process of manufacturing the flat panel detector as shown in FIG. 6 may comprise the following steps.

S100, forming a thin film transistor 12 on the substrate 10.

S200, forming a photodiode 11 on the substrate 10 on which the thin film transistor 12 is formed.

S300, forming a planarization layer 17 on the substrate 10 on which the photodiode 11 is formed.

S400, forming a signal line 19 on the substrate 10 on which the planarization layer 17 is formed.

S500, forming a first transparent conductive layer 20 on the substrate 10 on which the signal line 19 is formed, the orthographic projection of the first transparent conductive layer 20 on the substrate 10 covering the orthographic projection of the photodiode 11 on the substrate 10. Alternatively, S500', forming a first transparent conductive layer 20 and a conduction pattern synchronously on the substrate 10 on which the signal line 19 is formed, the orthographic projection of the first transparent conductive layer 20 on the substrate 10 covering the orthographic projection of the photodiode 11 on the substrate 10, the first transparent conductive layer 20 being located in the photosensitive region, and the conduction pattern being located in the bonding region.

S600, forming a scintillation layer 18 on the substrate 10 on which the first transparent conductive layer 20 is formed.

Of course, it is also possible to dispose an insulating layer or a passivation layer between layers as needed.

What have been described above are merely specific embodiments of the disclosure, but the scope of the present application is not so limited. Any variations or substitutions that can be readily conceived by a skilled person familiar with this technical field within the technical scope revealed by the disclosure should be encompassed within the scope of the application. Thus, the scope of the application should be subjected to the scope of the claims.

The invention claimed is:

1. A flat panel detector, comprising:
   a substrate;
   a plurality of photodiodes on the substrate;
   a first transparent conductive layer arranged on a side of the plurality of photodiodes away from the substrate, wherein an orthographic projection of the first transparent conductive layer on the substrate at least partially overlaps an orthographic projection of each photodiode of the plurality of photodiodes on the substrate;
   a signal line connected to a photodiode of the plurality of photodiodes and configured to provide a bias voltage to the photodiode, and
   a second transparent conductive layer on a side of each photodiode of the plurality of photodiodes facing the signal line,
   wherein an orthographic projection of the second transparent conductive layer on the substrate is within an orthographic projection of the photodiode on the substrate,
   wherein the first transparent conductive layer comprises a plurality of conductive patterns, the plurality of conductive patterns are connected together by conductive connection sections,
   wherein the flat panel detector further comprises a plurality of gate scanning lines and a plurality of data lines on the substrate, the plurality of gate scanning lines and the plurality of data lines intersect each other to form a plurality of photosensitive regions arranged in an array,
   wherein the plurality of conductive patterns are within the plurality of photosensitive regions respectively, each photosensitive region of the plurality of photosensitive regions comprises at least one photodiode of the plurality of the photodiodes, and
   wherein an orthographic projection of each conductive pattern of the plurality of conductive patterns on the substrate at least partially overlaps and orthographic projection of the at least one photodiode within a corresponding photosensitive region of the plurality of photosensitive regions on the substrate.

2. The flat panel detector according to claim 1, wherein the orthographic projection of the first transparent conductive layer on the substrate covers the orthographic projection of each photodiode of the plurality of photodiodes on the substrate.

3. The flat panel detector according to claim 1, wherein the first transparent conductive layer is configured to be electrically connected to a constant voltage source.

4. The flat panel detector according to claim 1, wherein the signal line is between the first transparent conductive layer and the photodiode.

5. The flat panel detector according to claim 4, wherein the flat panel detector comprises a passivation layer between the first transparent conductive layer and the signal line.

6. The flat panel detector according to claim 4, wherein the first transparent conductive layer is in direct contact with the signal line.

7. The flat panel detector according to claim 1, wherein the flat panel detector further comprises a thin film transistor on the substrate, the thin film transistor is electrically connected to a gate scanning line of the plurality of gate scanning lines, a data line of the plurality of data lines, and the at least one photodiode of the plurality of photodiodes, wherein an orthographic projection of a signal line on the substrate-overlaps an orthographic projection of an active layer of the thin film transistor on the substrate.

8. A flat panel detector, comprising:
   a substrate;
   a plurality of photodiodes on the substrate;
   a first transparent conductive layer arranged on a side of the plurality of photodiodes away from the substrate, wherein an orthographic projection of the first transparent conductive layer on the substrate at least partially overlaps and orthographic projection of each photodiode of the plurality of photodiodes on the substrate,
   a signal line connected to a photodiode of the plurality of photodiodes and configured to provide a bias voltage to the photodiode; and
   a second transparent conductive layer on a side of each photodiode of the plurality of photodiodes facing the signal line, wherein an orthographic projection of the second transparent conductive layer on the substrate is within an orthographic projection of the photodiode on the substrate,
   wherein the flat panel detector further comprises a plurality of gate scanning lines, a plurality of data lines and a thin film transistor on the substrate, wherein the thin film transistor is electrically connected to a gate scanning line of the plurality of gate scanning lines, a data line of the plurality of data lines and a photodiode of the plurality of photodiodes,
   wherein the first transparent conductive layer comprises an opening corresponding to the thin film transistor, wherein an orthographic projection of the opening on the substrate overlaps an orthographic projection of the thin film transistor on the substrate.

9. The flat panel detector according to claim 1, wherein the substrate comprises a bonding region, the flat panel detector further comprises a conduction pattern in the bonding region, and the conduction pattern is formed of a same material in a same layer as the first transparent conductive layer.

10. A method for manufacturing a flat panel detector, comprising:
    forming a photodiode on a substrate, the substrate comprising a bonding region;
    forming a signal line connected to the photodiode on the substrate, the signal line being configured to provide a working voltage to the photodiode;
    forming a first transparent conductive later on the signal line,
    wherein an orthographic projection of the first transparent conductive layer on the substrate is at least partially overlapping an orthographic projection of the photodiode on the substrate; and
    forming the first transparent conductive layer and forming a conduction pattern in the bonding region during a single patterning process.

11. The method according to claim 10, wherein the signal line is in direct contact with the first transparent conductive layer.

12. The method according to claim 10, further comprising:
    forming a passivation layer on the signal line prior to forming the first transparent conductive layer.

* * * * *